United States Patent [19]
Wu et al.

[11] Patent Number: 6,079,620
[45] Date of Patent: Jun. 27, 2000

[54] BOARD ADAPTER

[75] Inventors: Min-Fang Wu, Tu-Chen; Hung-Chi Yu, Taipei Hsien; Yu-Ming Ho, Pen-Chiao, all of Taiwan

[73] Assignee: Hon Hai Precision Ind. Co., Ltd., Taipei Hsien, Taiwan

[21] Appl. No.: 09/176,662

[22] Filed: Oct. 21, 1998

Related U.S. Application Data

[63] Continuation-in-part of application No. 08/961,750, Oct. 31, 1997.

[30] Foreign Application Priority Data

Oct. 21, 1997 [TW] Taiwan ............................ 85219426A01

[51] Int. Cl.[7] ................................ G06K 7/06; H05K 7/02
[52] U.S. Cl. .............................. 235/441; 361/760; 439/48
[58] Field of Search ..................................... 235/441, 486, 235/475, 492, 487; 361/760, 700, 805, 748, 778; 439/48, 71; 196/617

[56] References Cited

U.S. PATENT DOCUMENTS

| | | |
|---|---|---|
| 4,855,872 | 8/1989 | Wojnar et al. ........................... 361/414 |
| 4,982,831 | 1/1991 | Irie et al. ................................. 198/617 |
| 5,109,584 | 5/1992 | Irie et al. ............................. 198/343.1 |
| 5,174,762 | 12/1992 | Hoppal et al. ............................ 439/61 |
| 5,257,166 | 10/1993 | Mauri et al. ............................ 361/760 |
| 5,667,388 | 9/1997 | Cottrell ..................................... 439/74 |

*Primary Examiner*—Thien M. Le

[57] ABSTRACT

A board adapter for electrically transmitting signals between an electrical card connector and a mother board, includes a plurality of signal traces formed on both faces of the board adapter for electrically connecting signal holes with corresponding conductive pads. The signal holes respectively receive the corresponding contacts of the card connector. The conductive pads electrically engage with corresponding contacts disposed within a receiving slot defined in a card edge connector when the board adapter is inserted therein and stabilizing means ensures proper engagement therebetween. The stabilizing means comprises a cutout defined on a bottom edge of the board adapter and a post formed in the receiving slot of the card edge connector. The engagement between the cutout and the post ensures that the conductive pads of the board adapter are properly aligned with the contacts of the card edge connector.

4 Claims, 3 Drawing Sheets

BOARD ADAPTER

The present invention is a continuation in part of U.S. application Ser. No. 08/961,750 filed on Oct. 31, 1997, and relates to a board adapter having stabilizing means for ensuring proper signal transmission between a card connector and a mother board.

BACKGROUND OF THE INVENTION

The Prior Art

Electrical connectors are commonly provided with shielding and grounding means to overcome the affects of electromagnetic interference (EMI) and electrostatic discharge (ESD). For electrical card connectors, a board adapter is disposed between the connector and a mother board on which the card connector is mounted for transmitting signals therebetween. However, the board adapter may be adversely affected by EMI or cross talk between adjacent signal transmission traces disposed thereon.

The board adapter disclosed in U.S. patent application Ser. No. 08/961,750, which is assigned to the same assignee as the present invention, can effectively eliminate the affects of EMI and cross talk between adjacent signal traces. The board adapter receives contacts of the card connector in holes defined therethrough and the board adapter is received in a card edge connector mounted on a mother board. However, the engagement between the board adapter and the card edge connector may adversely affect signal transmission between the card edge connector and the mother board.

Therefore, an improved board adapter is required which can be stably engaged with a card edge connector.

SUMMARY OF THE INVENTION

Accordingly, the objective of the present invention is to provide stabilizing means between a board adapter and a card edge connector for ensuring proper signal transmission between a card edge connector and a printed circuit board.

To fulfill the above objectives, a board adapter for electrically transmitting signals between an electrical card connector and a mother board, has a front face and a rear face with a plurality of signal holes defined therethrough. A plurality of signal traces formed on both faces of the board adapter electrically connect the signal holes with corresponding conductive pads. The signal holes respectively receive the corresponding contacts of the card connector. The conductive pads electrically engage with corresponding contacts disposed within a receiving slot defined in a card edge connector when the board adapter is inserted therein and stabilizing means ensures proper engagement therebetween. The stabilizing means comprises a cutout defined on a bottom edge of the board adapter and a post formed in the receiving slot of the card edge connector. The engagement between the cutout and the post ensures that the conductive pads of the board adapter are properly aligned with the contacts of the card edge connector.

These and additional objectives, features, and advantages of the present invention will become apparent after reading the following detailed description of the preferred embodiment of the invention taken in conjunction with the appended drawing figures.

DETAILED DESCRIPTION OF THE PREFERRED EMBODIMENTS

Figure 1A:
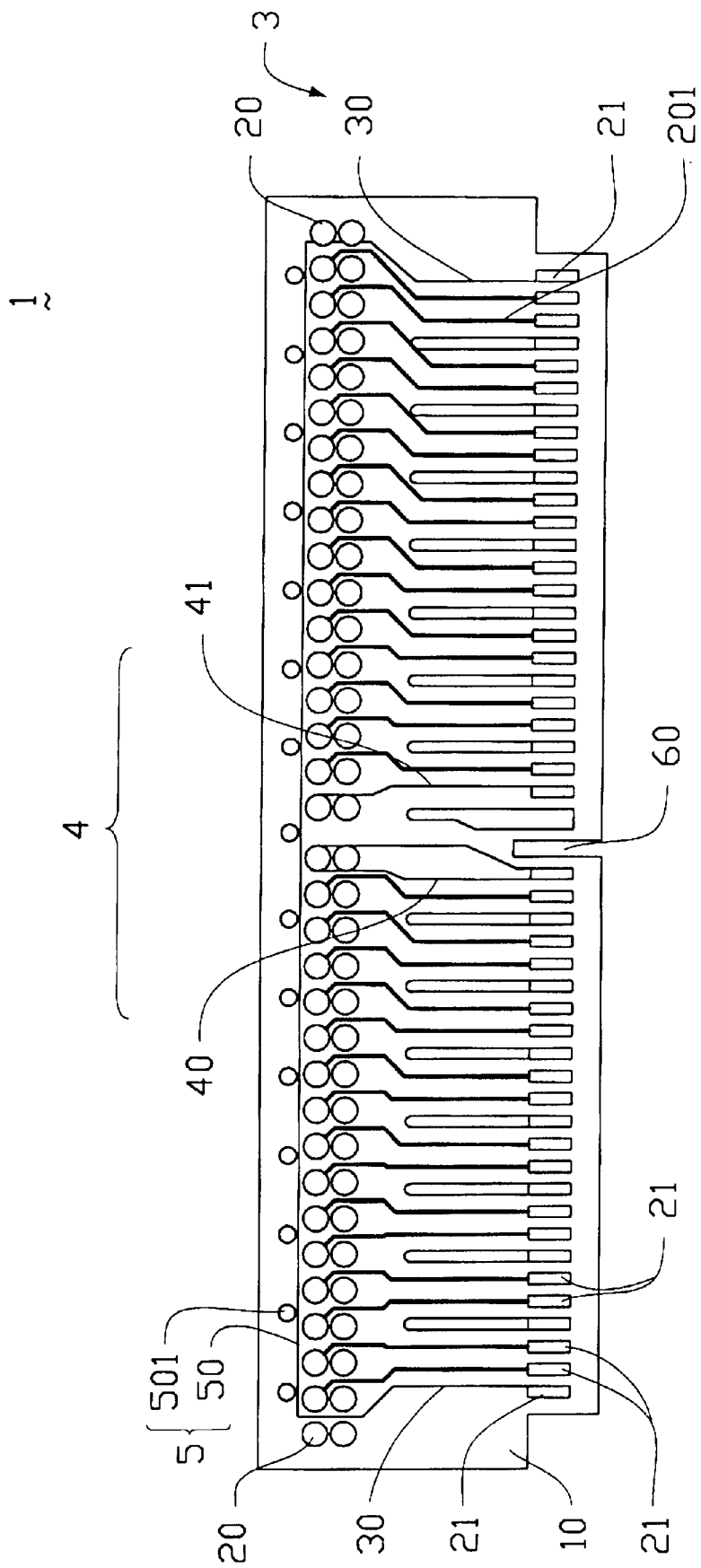
FIG. 1A is a front view of a board adapter in accordance with the present invention.
Figure 1B:
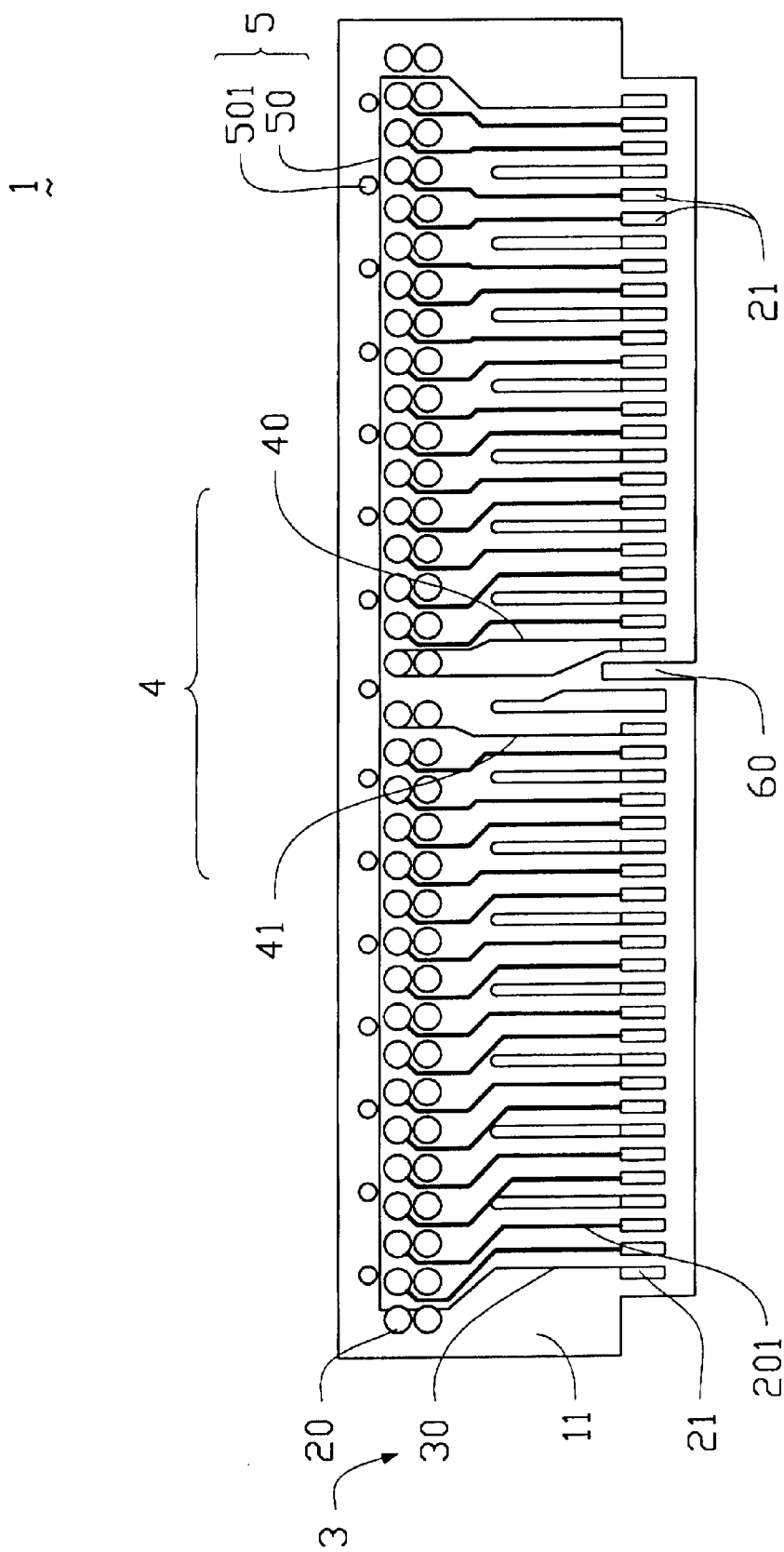
FIG. 1B is a rear view of a board adapter in accordance with the present invention.
Figure 2:
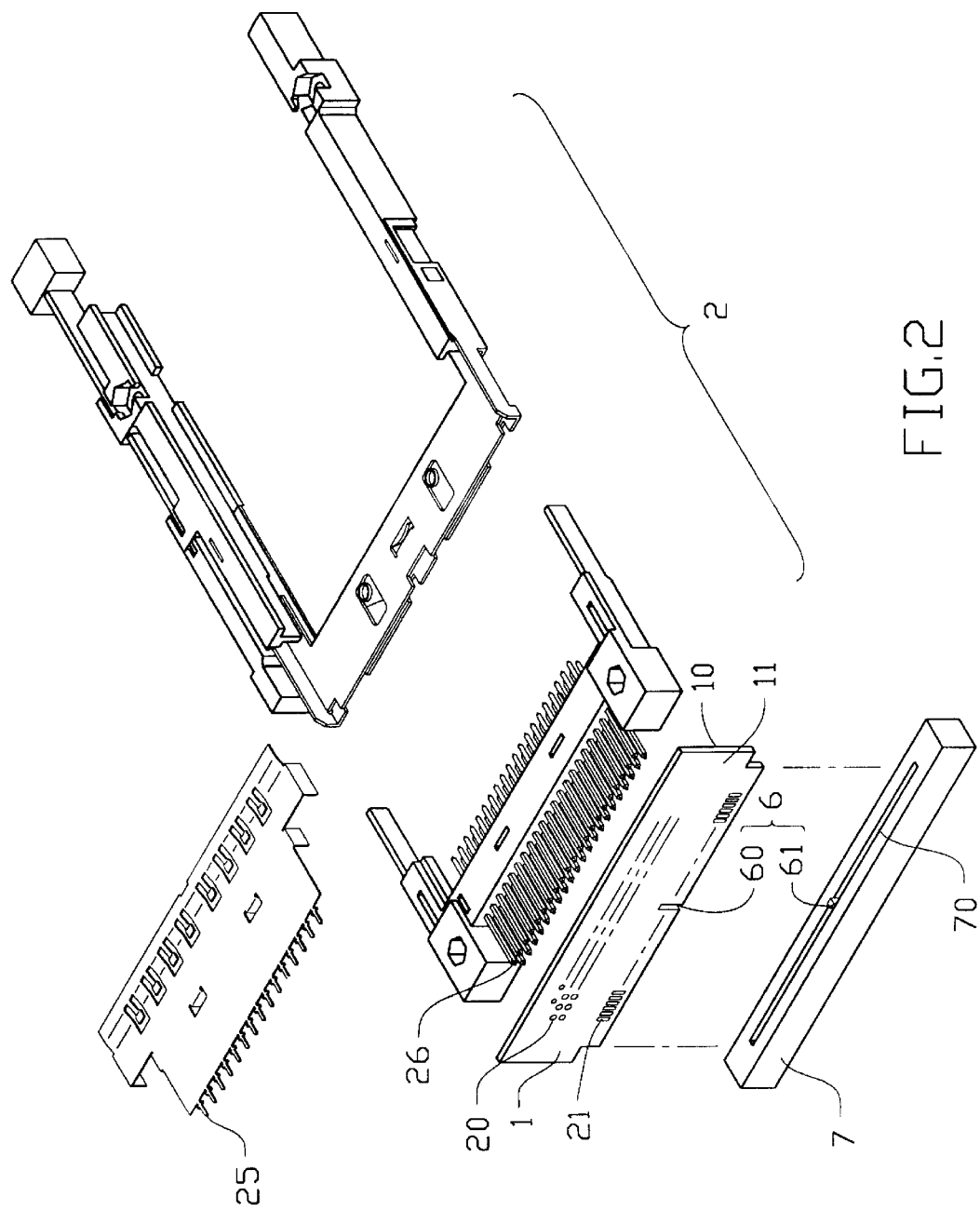
FIG. 2 is an exploded view of a card connector assembly including the board adapter and a card edge connector.

Detailed reference will now be made to the preferred embodiment of the present invention. As shown in FIGS. 1A, 1B, and 2, a board adapter 1 for electrically transmitting signals between an electrical card connector 2 and a mother board (not shown), has a front face 10 and a rear face 11 with a plurality of signal holes 20 defined therethrough. Each face 10, 11 includes a plurality of conductive pads 21, first grounding means 5, second grounding means 3, and transforming means 4.

The signal holes 20 and the conductive pads 21 are arranged according to the industrial standard established by the Personal Computer Memory Card International Association (PCMCIA). A plurality of signal traces 201 formed on both faces 10, 11 of the board adapter 1 electrically connect the signal holes 20 with the corresponding conductive pads 21. The signal holes 20 respectively receive the corresponding contacts 26 of the card connector 2.

The first grounding means 5 defines a plurality of grounding holes 50 through the board adapter 1 along a top edge thereof for receiving grounding terminals 25 of the card connector 2. The grounding holes 50 are serially connected on both faces 10, 11 of the board connector 1 by a horizontal grounding trace 51.

The second grounding means 3 consists of a plurality of grounding traces 30 alternately formed between every two signal traces 201 and electrical connected with a corresponding conductive pad 21 thereby providing the signal traces 201 with grounding protection. In addition, the two outermost grounding traces 30 on the front face 10 of the board adapter 1 are respectively connected to opposite ends of the horizontal grounding trace 51 of the first grounding means 5. The far right grounding trace 30 on the front face 10 of the board adapter 1 is further serially connected with the far right signal holes 20. Likewise, the two outermost grounding traces 30 on the rear face 11 of the board adapter 1 are respectively connected to opposite ends of the horizontal grounding trace 51 of the first grounding means 5. The far left grounding trace 30 on the rear face 11 of the board adapter 1 is further serially connected with the far left signal holes 20. Therefore, the signal holes 20 and the signal traces 201 are provided with grounding protection by the provision of the grounding traces 51, 30 of the first and second grounding means 5, 3.

The conductive pads 21 are electrically connected with either of the corresponding signal traces 201 or grounding traces 30. The conductive pads 21 electrically engage with corresponding contacts disposed within a receiving slot 70 defined in a card edge connector 7 when the board adapter 1 is inserted therein and stabilizing means 6 ensures proper engagement therebetween. The stabilizing means 6 comprises a cutout 60 defined on a bottom edge of the board adapter 1 and a post 61 formed in the receiving slot 70 of the card edge connector 7. The engagement between the cutout 60 and the post 61 ensures that the conductive pads 21 of the board adapter 1 are properly aligned with the contacts of the card edge connector 7.

The transforming means 4 consists of first and second power traces 40, 41 formed on each face 10, 11 of the board adapter 1. When the first power trace 40 bears a high voltage current, the second power trace 41 located on the same face 10 (11) is transformed into a grounding trace to provide grounding protection to the first power trace 40, and vice versa.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

Therefore, persons of ordinary skill in this art are to understand that all such equivalent structures are to be included within the scope of the following claims.

We claim:

1. A board adapter for insertion into a card edge connector for electrically connecting an electrical card connector and a mother board, comprising:

a front face and a rear face with a plurality of signal holes defined therethrough for receiving corresponding contacts of the card connector;

a plurality of conductive pads formed on at least one face near a bottom edge thereof for electrically engaging with corresponding contacts disposed within a receiving slot defined in the card edge connector;

a plurality of signal traces electrically connecting the signal holes with the corresponding conductive pads; and stabilizing means for ensuring that the conductive pads of the board adapter are properly aligned with the contacts of the card edge connector.

2. The board adapter as described in claim 1, wherein the stabilizing means comprises a cutout defined in the bottom edge of the board adapter and a post formed in the receiving slot of the card edge connector.

3. The board adapter as described in claim 1 further comprising a plurality of grounding traces electrical connected with the corresponding conductive pads for providing the signal traces with grounding protection.

4. The board adapter as described in claim 5, wherein the grounding traces are alternately formed between every two signal traces.

* * * * *